United States Patent
Chang et al.

(10) Patent No.: US 8,330,125 B2
(45) Date of Patent: Dec. 11, 2012

(54) ION BEAM TUNING

(75) Inventors: Shengwu Chang, South Hamilton, MA (US); Joseph C. Olson, Beverly, MA (US); Frank Sinclair, Quincy, MA (US); Matthew P. McClellan, Lancaster, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 261 days.

(21) Appl. No.: 12/887,068

(22) Filed: Sep. 21, 2010

(65) Prior Publication Data

US 2012/0068081 A1    Mar. 22, 2012

(51) Int. Cl.
*H01J 37/10* (2006.01)
(52) U.S. Cl. ............ 250/492.1; 250/396 R; 250/396 ML
(58) Field of Classification Search .... 250/492.1–492.3, 250/396 R, 396 ML
See application file for complete search history.

(56) References Cited

U.S. PATENT DOCUMENTS

| 6,903,350 B1* | 6/2005 | Vanderberg et al. | 250/492.21 |
| 2006/0169922 A1* | 8/2006 | Chang et al. | 250/492.21 |
| 2008/0067436 A1* | 3/2008 | Vanderberg et al. | 250/492.21 |

FOREIGN PATENT DOCUMENTS

| EP | 1662544 A2 | 5/2006 |
| EP | 1983549 A2 | 10/2008 |

* cited by examiner

*Primary Examiner* — Michael Maskell

(57) ABSTRACT

A beam line ion implanter includes an ion source configured to generate an ion beam, a scanner configured to scan the ion beam to produce a scanned ion beam having trajectories which diverge from a scan origin, and a focusing element having a focusing field positioned upstream of the scanner configured to focus the ion beam to a focal point at the scan origin. A method of ion beam tuning includes generating an ion beam, focusing the ion beam to a focal point positioned at a scan origin, and scanning the ion beam to produce a scanned ion beam having trajectories which diverge from the scan origin.

13 Claims, 4 Drawing Sheets

ION BEAM TUNING

FIELD

This disclosure relates generally beam line ion implanters, and more particularly to ion beam tuning.

BACKGROUND

A beam line ion implanter generates an ion beam and directs it at a workpiece for treatment. The workpiece may be, for example, a semiconductor wafer or another object receiving ion treatment for material modification. The beam line ion implanter includes an ion source to generate the ion beam and beam line components to control and direct the ion beam toward the workpiece. The beam line components may include a mass analyzer and a scanner downstream of the mass analyzer. The scanner is configured to scan the ion beam back and forth is in a scanned plane at a scan frequency to produce a scanned ion beam having trajectories which diverge from a scan origin. The scanner may be an electrostatic scanner or a magnetic scanner. An angle corrector downstream of the scanner accepts the scanned ion beam with diverging trajectories and deflects the same in an effort to produce more parallel trajectories of the scanned ion beam. The scanned ion beam may be distributed across a front surface of the workpiece by driving the workpiece orthogonal to the scanned plane.

The ions of the scanned ion beam strike the workpiece at an angle of incidence. Controlling this angle of incidence and minimizing a local beam angle spread of the ion beam is becoming increasingly important for some applications. One such application is a channeling ion implant into a semiconductor wafer. The semiconductor wafer may be fabricated of silicon and the crystalline lattice of the silicon may be oriented to promote channeling. If the angle of incidence varies slightly from a desired angle, the amount of channeling may be adversely reduced. The reduction in channeling is typically exacerbated at higher ion beam energies. Controlling the angle of incidence and the parallelism of the ion beam also helps to improve uniformity of the dose into a semiconductor wafer or other workpiece.

A conventional beam line ion implanter having a mass analyzer, a mass resolving aperture downstream of the mass analyzer, and a scanner focuses the ion beam to a focal point at the mass resolving aperture. Therefore, the ion beam has expanded by the time it reaches a scan origin of the scanner downstream of the mass resolving aperture. One drawback with this conventional beam line ion implanter is that the local beam angle spread of the ion beam may be unacceptably high for angle sensitive applications. In one experiment, a high energy [3 mega electron-volts (MeV)] ion beam of boron ions had a local beam angle spread of 0.06°. That is, the maximum deviation about a local beam angle mean was 0.06°. Such a deviation may adversely impact the amount of channeling and hence the resulting depth that dopant ions are implanted into a semiconductor wafer. In addition, the resulting uniformity of dose may also be adversely impacted.

Accordingly, it would be desirable to provide a beam line ion implanter and method which overcomes the above-described inadequacies and shortcomings.

SUMMARY

According to a first aspect of the disclosure a beam line ion implanter is provided. The beam line ion implanter includes an ion source configured to generate an ion beam, a scanner configured to scan the ion beam to produce a scanned ion beam having trajectories which diverge from a scan origin, and a focusing element having a focusing field positioned upstream of the scanner configured to focus the ion beam to a focal point at the scan origin.

According to yet another aspect of the disclosure, a method of ion beam tuning is provided. The method includes generating an ion beam, focusing the ion beam to a focal point positioned at a scan origin, and scanning the ion beam to produce a scanned ion beam having trajectories which diverge from the scan origin.

The present disclosure will now be described in more detail with reference to exemplary embodiments as shown in the accompanying drawings. While the to present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

For a better understanding of the present disclosure, reference is made to the accompanying drawings, in which like elements are referenced with like numerals, and in which.

DETAILED DESCRIPTION

Figure 1:
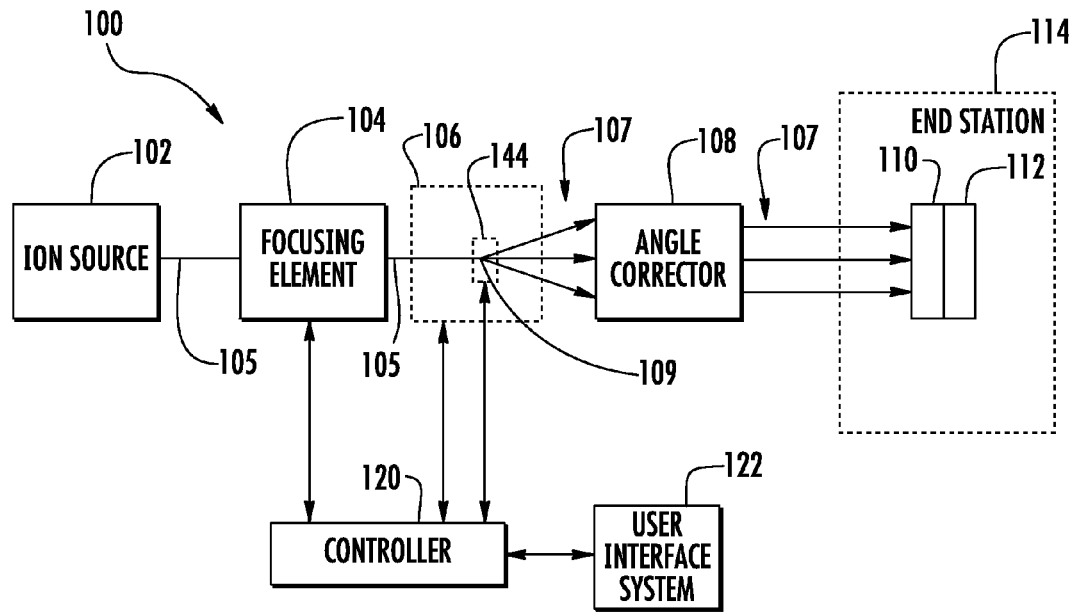
FIG. 1 is a block diagram of a beam line ion implanter consistent with the present disclosure.

FIG. 1 illustrates a block diagram of a beam line ion implanter 100 consistent with the present disclosure. The beam line ion implanter 100 includes an ion source 102, a focusing element 104, a scanner 106, a beam current sensing apparatus 144, an angle corrector 108, an end station 114, a controller 120, and a user interface system 122. The ion source 102 is configured to generate an ion beam 105. The ion source 102 may be any type of ion source such as an indirectly heated cathode (IHC) ion source having a cathode that is heated to thermionic emission temperatures by a filament to emit electrons into an arc chamber. As known in the art, an extraction electrode assembly may extract ions from plasma in the arc chamber through an extraction aperture into the well defined ion beam 105. The ion beam 105 extracted from the ion source 102 may be a spot beam having an approximately circular cross sectional shape when extracted from the ion source 102. The cross sectional shape of the spot beam may vary as it propagates down the beam line and may also have an irregular shape in some instances.

The focusing element 104 has a focusing field configured to focus the ion beam to a focal point. The focusing field may be, for example, an electric field or magnetic field depending on the type of focusing element. In one instance, the focusing element 104 may be an electrostatic lens having one or more electrodes that are biased by one or more power supplies to create electric field forces for focusing the ion beam 105. The electrostatic lens may also be an acceleration/deceleration column and/or a quadrupole lens in some beam line ion implanters.

The scanner 106 is configured to scan or deflect the ion beam 105 back and forth in a scanned plane to produce a scanned ion beam 107 having trajectories which diverge from a scan origin 109. The scanner 104 may be an electrostatic scanner or a magnetic scanner. An electrostatic scanner may include one or more sets of scan electrodes in the form of scan plates that may be spaced apart to define a gap. The ion beam 105 may be directed through the gap and deflected by an electric field in the gap. A magnetic scanner may include magnetic polepieces and a coil that constitute an electromagnet. The magnetic polepieces may be spaced apart to define a gap through with the ion beam 105 may be directed and deflected by a magnetic field in the gap.

The angle corrector 108 deflects the scanned spot beam 107 with diverging trajectories and provides the scanned spot beam 107 with nearly collimated ion beam paths have substantially parallel ion path trajectories. The angle corrector 108 may be an angle corrector magnet or a parallelizing electrostatic lens.

The end station 114 may include a platen 112 to support a workpiece 110 such that ions of a desired species strike the workpiece 110. The workpiece 110 may be, for example, a semiconductor wafer or another object receiving ion treatment for material modification. The workpiece 110 can also take various physical shapes such as a common disk shape. The end station 114 may also include a wafer drive system (not illustrated) to physically move the workpiece 110 to and from the platen 112 from holding areas. The workpiece 110 may be clamped to the platen 112 using known techniques such as electrostatic clamping. The end station 114 may also include a platen drive system to drive the platen 112 and hence the workpiece 110 clamped thereto in a desired fashion. For example, the platen drive may include servo drive motors, screw drive mechanisms, to mechanical linkages, and any other components as are known in the art.

The controller 120 may receive input data and instructions from any variety of systems and components of the beam line implanter 100 and provide output signals to control the same. The controller 120 can be or include a general-purpose computer or network of general-purpose computers that may be programmed to perform desired input/output functions. The controller 120 can also include other electronic circuitry or components, such as application specific integrated circuits, other hardwired or programmable electronic devices, discrete element circuits, etc. The controller 120 may also include communication devices, data storage devices, and software. The user interface system 122 may include, but not be limited to, devices such as touch screens, keyboards, user pointing devices, displays, printers, etc. to allow a user to input commands and/or data and/or to monitor the beam line ion implanter 100 via the controller 120.

Figure 2:
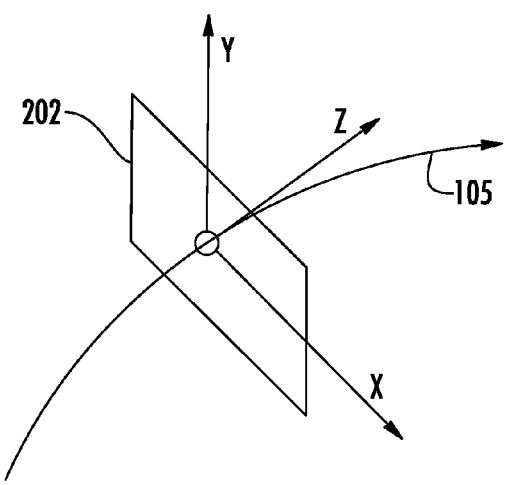
FIG. 2 illustrates a Cartesian coordinate system relative to a trajectory of the ion beam of the beam line ion implanter of FIG. 1.

Turning to FIG. 2, a Cartesian coordinate system is defined in order to assist with explanation of operation of the beam line ion implanter 100. The Cartesian coordinate system includes a Z axis defined by a central trajectory of the ion beam 105. A plane 202 perpendicular to the Z axis includes an X and Y axis. The X axis is a horizontal axis of the plane 202 and the Y axis is a vertical axis of the plane 202 which is orthogonal to the X axis. The Z axis therefore changes as the trajectory of the ion beam 105 changes and is tangent to the trajectory as the ion beam may curve at different places along the beam line.

In operation, the ion source 102 of the beam line ion implanter 100 is configured to generate an ion beam 105. The ion beam 105 may be a spot beam having an approximately circular cross sectional shape when extracted from the ion source 102. The scanner 106 is configured to scan the ion beam to produce a scanned ion beam 107 having trajectories which diverge from a scan origin 109. The focusing element 104 having a focusing field positioned upstream of the scanner 106 is configured to focus the ion beam 105 to a focal point at the scan origin 109. The ion beam 105 may have a varying width in the X dimension as it travels down the beam line and the focal point may occur when a width of the ion beam 105 in the X dimension is at a minimum.

Figure 3:
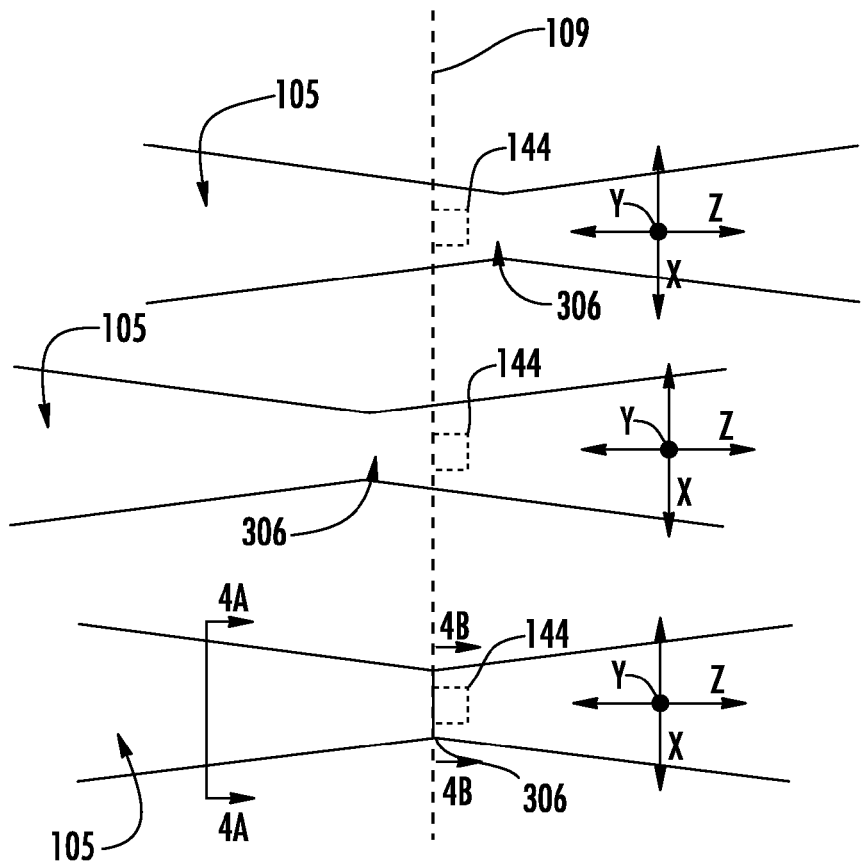
FIG. 3 is an exploded plan view of the ion beam of FIG. 1 proximate the scan origin.

Turning to FIG. 3, an exploded plan view of the ion beam 105 as it travels downstream in the Z direction is illustrated. The Y axis is coming out of the page and the width of the ion beam 105 along the X dimension varies as the ion beam propagates down the beam line. The focal point 306 may occur when the width of the ion beam 105 along the X axis is at a minimum. In the upper most example of FIG. 3, the ion beam 105 has its focal point 306 positioned downstream of the scan origin 109 of the scanner 106. In the middle example of FIG. 3, the ion beam 105 has its focal point 306 positioned upstream of the scan origin 109. Finally, in the lower most example of FIG. 3, the ion beam 105 has its focal point 306 at the scan origin 109.

Figure 4A:
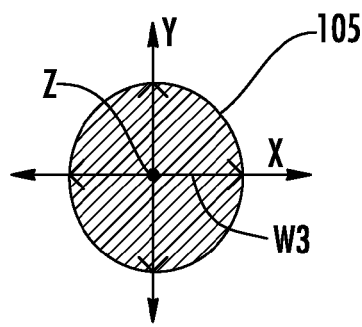
FIG. 4A is a cross sectional view of the ion beam of FIG. 3 taken along the line 4A-4A of FIG. 3.
Figure 4B:
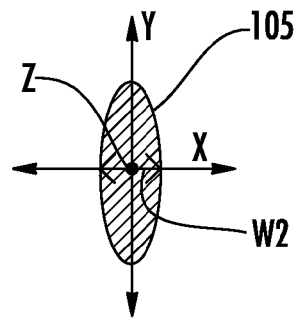
FIG. 4B is a cross sectional view of the ion beam of FIG. 3 taken along the line 4B-4B of FIG. 3.

FIG. 4A is a cross sectional view of the ion beam 105 looking downstream in the direction of travel of the ion beam 105 taken along the line 4A-4A of FIG. 3. Similarly, FIG. 4B is a cross sectional view of the ion beam 105 looking downstream in the direction of travel of the ion beam taken along the line 4B-4B of FIG. 3. FIG. 4B illustrates an approximate shape of the ion beam 105 when it is focused to its focal point 306. The width (W3) of the ion beam 105 illustrated in FIG. 4A is considerably wider than its minimum width (W2) illustrated in FIG. 4B which occurs at the focal point 306. In one embodiment, the minimum width (W2) is about 3 millimeters (mm). Although FIGS. 4A and 4B illustrate somewhat similar heights of the ion beam 105 in the Y dimension, this need not be the case as the height may also vary. The cross sectional shape of the ion beam 105 may also to be an irregular shape in some instances.

Figure 5:
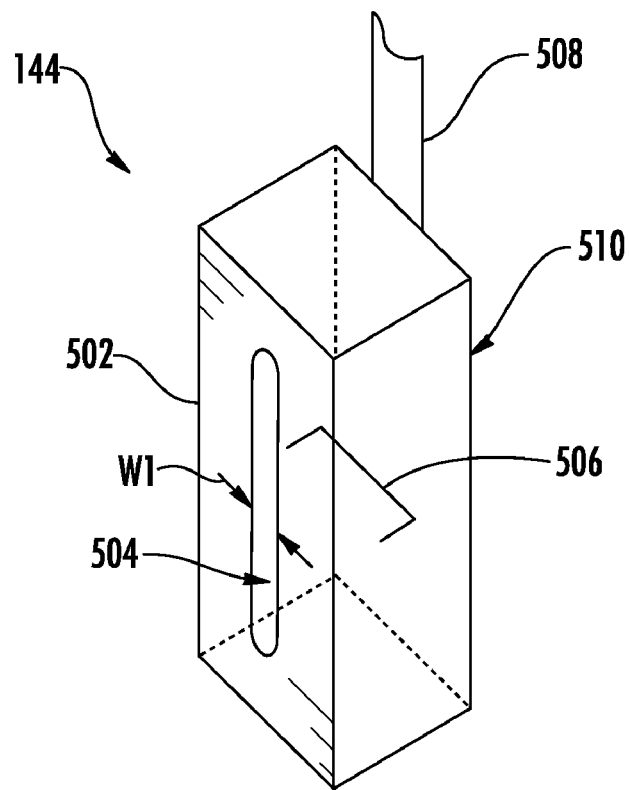
FIG. 5 is a perspective view of one embodiment of a beam current sensing apparatus.

Turning to FIG. 5, a perspective view of one embodiment of a beam current sensing apparatus 144 positioned at the scan origin 109 during an ion beam set up procedure is illustrated. The beam current sensing apparatus 144 may include a plate 502 having an elongated aperture 504. The beam current sensing apparatus 144 may further include a beam current sensor 506 such as a Faraday cup positioned downstream of the aperture 504. The plate 502 and beam current sensor 506 may further be integrated into a traveling assembly 510 supported by an arm 508. Alternatively, the beam current sensor 506 may not be in the same traveling assembly as long as it is positioned downstream of a properly positioned plate having the elongated aperture 504. The arm 508 may be driven by an actuator (not illustrated) and controlled by the controller 120 to position the elongated aperture 504 of the plate 502 at the scan'origin 109 during a beam set up procedure. The elongated aperture 504 may have a width (W1) in the X dimension that is less than the minimum width (W2) of the ion beam 105 at its focal point 306 as illustrated in FIG. 4B. In one instance, the width (W1) of the elongated aperture in the X dimension may be 2 mm and the minimum width (W2) of the ion beam 105 at its focal point 306 in the same X dimension may be 3 mm.

Figure 6:
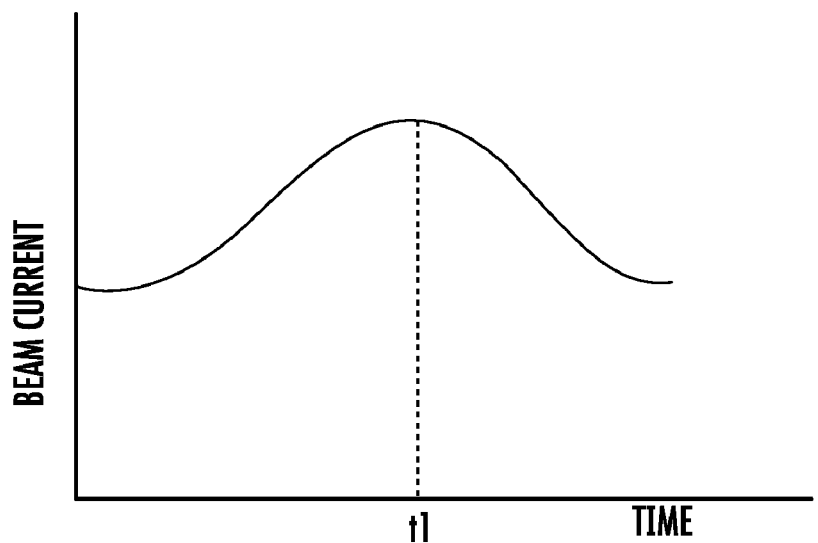
FIG. 6 is a plot of beam current versus time.

In operation, the beam current sensing apparatus 144 is positioned at the scan origin 109 during a beam set up procedure. More particularly, the plate 502 having the elongated aperture 504 may be positioned along the Z axis at the scan origin 109. The elongated aperture 504 allows a portion of the ion beam 105 to pass there through to the downstream beam current sensor 506. The beam current sensor 506 may then sense a beam current value of this portion of the ion beam 105. As the plot in FIG. 6 illustrates, the beam current value of this portion of the ion beam 105 varies as the focusing element 104 focuses the ion beam 105. At time (t1), the beam current sensed by the beam current sensor 506 is at a maximum value indicating the focal point 306 is at the scan origin 109. For example, with reference to FIG. 3, if the focal point 306 is downstream of the scan origin 109 as illustrated in the upper most example of FIG. 3, the beam current sensed by the beam current sensor will be less than a maximum value because the same amount of beam current is dispersed over a greater distance in the X dimension. Similarly, if the foal point 306 is upstream of the scan origin 109 as illustrated in the middle example of FIG. 3, the beam current sensed by the beam current sensor is also less than the maximum value. Finally, it is not until the focal point 306 is aligned with the scan origin 109 as illustrated in the lower most example of FIG. 3, that the beam current sensor senses the maximum value at time (W.

In yet another embodiment, the beam current sensing apparatus 144 may include a beam current sensor having a width in the X dimension that is less than the minimum width (W2) of the ion beam in the X dimension at its focal point 306. In one embodiment, the beam current sensor may have an elongated shape somewhat similar to the aperture 504 and be fabricated of conductive material such as graphite.

In yet another embodiment, a camera may be positioned relative to the ion beam 105 to capture images of the same proximate the scan origin 109. The images of the ion beam 105 captured by the camera may be input to the controller 120. In response, the controller 120 may instruct the focusing element 104 to make adjustments to focus the ion beam to a focal point at the scan origin.

Accordingly, there is thus provided a beam line ion implanter including a focusing element having a focusing field positioned upstream of a scanner configured to focus the ion beam to a focal point at the scan origin. Advantageously, by focusing the ion beam to the focal point at the scan origin, a local beam angle spread of the ion beam 105 is minimized. This is desirable for some applications such as high energy ion beams for channeling implants.

Figure 7:
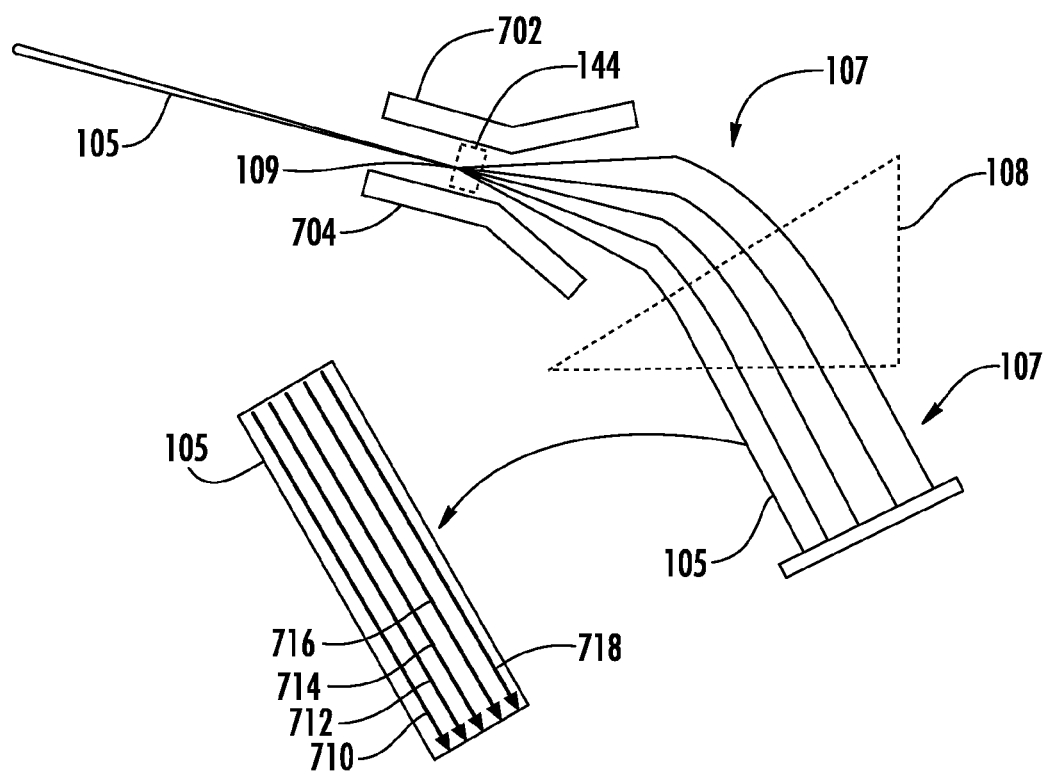
FIG. 7 is a block diagram of portions of a beam line ion implanter consistent with FIG. 1 illustrating local beam angle spread.

FIG. 7 is a block diagram that illustrates a minimized local beam angle spread. The scanner 106 in the embodiment of FIG. 7 is an electrostatic scanner having scan plates 702, 704 spaced apart to form a gap. In operation, the ion beam 105 is focused to a focal point at the scan origin 109 as previously detailed. The angle corrector 108 downstream of the scanner acts as a lens to deflect the diverging trajectories of the scanned ion beam 107 to more parallel trajectories. The ion beam 105 output the angle corrector 108 also has local ion trajectories. For example, an exploded view of the ion beam 105 striking one edge of the workpiece 110 is illustrated where individual beamlets 710, 712, 714, 716, and 718 advantageously have minimal local beam angle spread and are therefore advantageously closely parallel to each other.

In one experiment, a 3 MeV ion beam of boron ions exhibited only a 0.01° local beam angle spread by focusing the ion beam to a focal point at the scan origin. The local beam angle spread is the maximum deviation about the local beam angle mean. For instance, if the central beamlet 714 represents the local beam angle mean at an incident angle of 0° and the maximum deviation from this local beam angle mean by any other beamlet 710, 712, 716, and 718 is 0.01°, then the local beam angle spread is 0.01°. The beamlets 710, 712, 714, 716, and 718 are also therefore advantageously closely parallel to each other. In addition, controlling the local beam angle spread also helps improve parallelism globally when comparing the ion beam 105 at different positions that strikes the workpiece 110.

In contrast, experimental data indicated the same 3 MeV ion beam of boron ions had a much higher local beam angle spread of 0.06° when the focal point of the beam occurred at the mass resolving slit. Furthermore, the resulting uniformity on an implanted silicon wafer as the workpiece improved from 0.7% to 0.3% as measured by a Therma-Wave® probe.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A beam line ion implanter comprising:
an ion source configured to generate an ion beam;
a scanner configured to scan the ion beam to produce a scanned ion beam having trajectories which diverge from a scan origin;
a focusing element having a focusing field positioned upstream of the scanner configured to focus the ion beam to a focal point at the scan origin; and
a beam current sensing apparatus positioned at the scan origin during an ion beam set up procedure, wherein the beam current sensing apparatus is configured to sense a current representative of a beam current of the ion beam at the scan origin, and wherein the focusing element is configured to focus the ion beam until a maximum current is sensed by the beam current sensing apparatus to focus the ion beam to the focal point at the scan origin.

2. The beam line ion implanter of claim 1, wherein the beam current sensing apparatus comprises a plate having an elongated aperture positioned at the scan origin during the ion beam set up procedure, and a beam current sensor positioned downstream of the plate during the ion beam set up procedure, wherein the elongated aperture allows a portion of the ion beam to pass to the beam current sensor.

3. The beam line ion implanter of claim 2, wherein the plate and the beam current sensor are integrated into a traveling assembly.

4. The beam line ion implanter of claim 2, wherein the elongated aperture has a first width in a first dimension and the ion beam has a second width in the first dimension at the focal point, wherein the first width is less than the second width.

5. The beam line ion implanter of claim 4, wherein the first width is about 2 millimeters (mm) and the second width is about 3 mm.

6. The beam line ion implanter of claim 1, wherein the beam current sensing apparatus comprises a beam current sensor having a first width in a first dimension and the ion beam has a second width in the first dimension at the focal point, wherein the first width is less than the second width.

7. The beam line ion implanter of claim 1, wherein the focusing element comprises an electrostatic lens.

8. The beam line ion implanter of claim 1, wherein the focal point occurs when a width of the ion beam is at a minimum width.

9. A method of ion beam tuning comprising:
generating an ion beam;
focusing the ion beam to a focal point positioned at a scan origin;
scanning the ion beam to produce a scanned ion beam having trajectories which diverge from the scan origin; and
sensing a current representative of a beam current of the ion beam at the scan origin, and wherein the focusing the ion beam to the focal point at the scan origin further comprises adjusting the ion beam until the current at the scan origin is at a maximum current.

10. The method of claim 9, wherein the sensing comprises positioning a plate having an elongated aperture at the scan origin, and a beam current sensor downstream of the plate, wherein the elongated aperture allows a portion of the ion beam to pass to the beam current sensor, and wherein the aperture has a first width in a first dimension, and the ion beam has a second width in the first dimension at the focal point, wherein the first width is less than the second width.

11. The method of claim 10, wherein the first width is about 2 mm and the second width is about 3 mm.

12. The method of claim 9, wherein the sensing comprises positioning a beam current sensor having a first width in a first dimension at the scan origin, wherein the ion beam has a second width in the first dimension at the focal point, wherein the first width is less than the second width.

13. The method of claim 9, wherein the ion beam has a width in a first dimension upstream of the scan origin, and wherein the focusing the ion beam to the focal point positioned at the scan origin comprises narrowing the width to a minimum width at the scan origin.

* * * * *